US008872025B2

(12) United States Patent
Tamai et al.

(10) Patent No.: US 8,872,025 B2
(45) Date of Patent: Oct. 28, 2014

(54) WATERPROOF STRUCTURE OF ELECTRONIC UNIT

(75) Inventors: Toshio Tamai, Kashiwara (JP);
Takahiro Sanada, Kashihara (JP)

(73) Assignee: Jtekt Corporation, Osaka-shi (JP)

( * ) Notice: Subject to any disclaimer, the term of this patent is extended or adjusted under 35 U.S.C. 154(b) by 283 days.

(21) Appl. No.: 13/418,816

(22) Filed: Mar. 13, 2012

(65) Prior Publication Data

US 2012/0236479 A1   Sep. 20, 2012

(30) Foreign Application Priority Data

Mar. 16, 2011   (JP) .................................. 2011-058269
Jul. 26, 2011   (JP) .................................. 2011-163087

(51) Int. Cl.

| H01R 13/46 | (2006.01) |
|---|---|
| H01R 13/58 | (2006.01) |
| H01R 13/52 | (2006.01) |
| H05K 5/06 | (2006.01) |
| H02G 15/013 | (2006.01) |
| B62D 5/04 | (2006.01) |
| H05K 5/00 | (2006.01) |

(52) U.S. Cl.
CPC ........ *H01R 13/5812* (2013.01); *H01R 13/5216* (2013.01); *H05K 5/069* (2013.01); *H02G 15/013* (2013.01); *B62D 5/0406* (2013.01); *H01R 13/5227* (2013.01); *H05K 5/0069* (2013.01); *H05K 5/064* (2013.01); *H01R 13/5816* (2013.01)
USPC ............. 174/60; 361/730; 361/728; 361/737; 174/50.5; 174/59; 174/58; 174/77 R; 174/667

(58) Field of Classification Search
CPC ... B62D 5/0406; H02G 3/088; H02G 15/013; H01F 27/04; H01L 31/048; H01R 13/52; H05K 5/0034; H05K 5/06; H05K 5/0026; H05K 5/0043; H05K 5/0091
USPC ......... 361/719, 714, 728, 715, 730, 737, 679, 361/1; 220/3.2–3.8, 3.92, 3.94, 4.02
See application file for complete search history.

(56) References Cited

U.S. PATENT DOCUMENTS 4,515,345 A * 5/1985 Inden et al. ............... 251/129.15
4,533,201 A * 8/1985 Wasserlein, Jr. ............. 439/404

(Continued)

FOREIGN PATENT DOCUMENTS

| EP | 2 161 790 A1 | 3/2010 |
|---|---|---|
| JP | A-2005-80370 | 3/2005 |

(Continued)

OTHER PUBLICATIONS

Jul. 9, 2014 extended European Search Report issued in Application No. 12159728.

*Primary Examiner* — Tuan T Dinh
*Assistant Examiner* — Steven T Sawyer
(74) *Attorney, Agent, or Firm* — Oliff PLC (57) ABSTRACT

A waterproof structure of an electronic unit includes a case that defines a housing portion housing a first terminal, and a connector that includes an insulating body attached to the case. The connector includes a second terminal that is supported by the insulating body and connects a conductor end portion of a cable to the first terminal. The insulating body includes a wall portion that partitions a part of the housing portion by covering an open portion of the case. The insulating body includes a cable lead-in portion that defines a cable lead-in hole for leading the cable into the case and is joined to the wall portion. A potting resin is filled in a space between the inner periphery of the cable lead-in hole and the outer periphery of the cable and the housing portion and cured.

9 Claims, 10 Drawing Sheets

(56) References Cited

U.S. PATENT DOCUMENTS

| | | | |
|---|---|---|---|
| 5,569,882 A | 10/1996 | Yokoyama et al. | |
| 5,586,909 A * | 12/1996 | Saba | 439/559 |
| 5,912,433 A * | 6/1999 | Pulido et al. | 174/77 R |
| 6,172,304 B1 * | 1/2001 | Laurent et al. | 174/74 R |
| 6,225,557 B1 * | 5/2001 | Fonteneau et al. | 174/50 |
| 6,344,612 B1 * | 2/2002 | Kuwahara et al. | 174/50 |
| 6,627,817 B1 | 9/2003 | Kortenbach | |
| 7,233,495 B2 | 6/2007 | Tomikawa et al. | |
| 7,413,446 B1 | 8/2008 | Jilg et al. | |
| 7,877,868 B2 | 2/2011 | Tomikawa et al. | |
| 2002/0045376 A1 * | 4/2002 | Abe et al. | 439/374 |
| 2002/0179140 A1 * | 12/2002 | Toyomura | 136/251 |
| 2004/0149948 A1 * | 8/2004 | Callis et al. | 251/129.15 |
| 2004/0261835 A1 | 12/2004 | Utsunomiya et al. | |
| 2005/0047095 A1 | 3/2005 | Tomikawa et al. | |
| 2007/0195504 A1 | 8/2007 | Tomikawa et al. | |
| 2007/0249189 A1 * | 10/2007 | Kaneko et al. | 439/76.2 |
| 2008/0149386 A1 * | 6/2008 | Kanamaru et al. | 174/520 |
| 2008/0176425 A1 | 7/2008 | Sakakura | |
| 2009/0302034 A1 * | 12/2009 | Makela et al. | 220/3.8 |
| 2010/0107398 A1 | 5/2010 | Girard | |
| 2010/0108375 A1 | 5/2010 | Richter | |
| 2012/0145242 A1 | 6/2012 | Kouyanagi | |

FOREIGN PATENT DOCUMENTS

| | | |
|---|---|---|
| JP | A-2005-160206 | 6/2005 |
| JP | A-2005-183796 | 7/2005 |
| JP | A-2008-244379 | 10/2008 |
| WO | WO 2011/024752 A1 | 3/2011 |

* cited by examiner

WATERPROOF STRUCTURE OF ELECTRONIC UNIT

BACKGROUND OF THE INVENTION

1. Field of the Invention

The present invention relates to a waterproof structure of an electronic unit.

2. Description of Related Art

In the space inside a case main body housing circuit bodies constituting an electric power circuit, a technology for forming a waterproof layer by filling a liquid waterproofing resin at a portion to be waterproofed and curing the resin, has been proposed (refer to, for example, Japanese Published Unexamined Patent Application No. 2005-80370).

In addition, a technology for waterproofing and protecting a printed circuit board inside a case by curing a potting material in liquid form injected into a liquid reservoir portion inside the case, has been proposed (refer to, for example, Japanese Published Unexamined Patent Application No. 2005-160206).

For connecting a cable to a circuit inside a case, a method by which a connector on an end portion of the cable is connected to a connector on the case side is generally used. To prevent water from entering the inside of the case, a waterproof connector with a waterproof cap made of rubber is typically used as each connector.

However, the waterproof connector with a waterproof cap is structurally complicated and high in manufacturing cost.

An object of the present invention is to provide a waterproof structure of an electronic unit which does not require use of a connector with a waterproof cap and is structurally simple.

SUMMARY OF THE INVENTION

In order to achieve the above-described object, an aspect of the present invention provides a waterproof structure of an electronic unit including a case that defines a housing portion housing a first terminal and has an open portion capable of opening the housing portion, a connector including an insulating body attached to the case and a second terminal supported by the insulating body and connecting a conductor end portion of a cable to the first terminal, and a potting resin. The insulating body includes a wall portion that partitions a part of the housing portion by covering the open portion, and a cable lead-in portion that defines a cable lead-in hole for leading the cable into the case and is joined to the wall portion. The potting resin is filled in a space between an inner periphery of the cable lead-in hole and an outer periphery of the cable and the housing portion, and cured.

According to the present invention, the connector is attached to the case, the second terminal of the connector is connected to the first terminal of the case, and the open portion of the case is closed by the wall portion of the insulating body of the connector. Accordingly, a part of the housing portion of the case is defined by the wall portion of the insulating body of the connector. Next, a potting resin in liquid form is filled in the space between the inner periphery of the cable lead-in hole and the outer periphery of the cable and the housing portion of the case. Thereafter, due to the cured potting resin, a waterproof function is obtained. It becomes unnecessary to use a connector with a waterproof cap that is used conventionally, and the structure can be simplified.

BRIEF DESCRIPTION OF THE DRAWINGS

FIG. 2A and FIG. 2B are sectional views of an essential portion of the waterproof structure of an electronic unit. FIG. 2A shows a state after manufacturing, and FIG. 2B shows a potting process.

DETAILED DESCRIPTION OF THE PREFERRED EMBODIMENT

Hereinafter, an embodiment of the present invention is described in detail with reference to the drawings.

Figure 1:
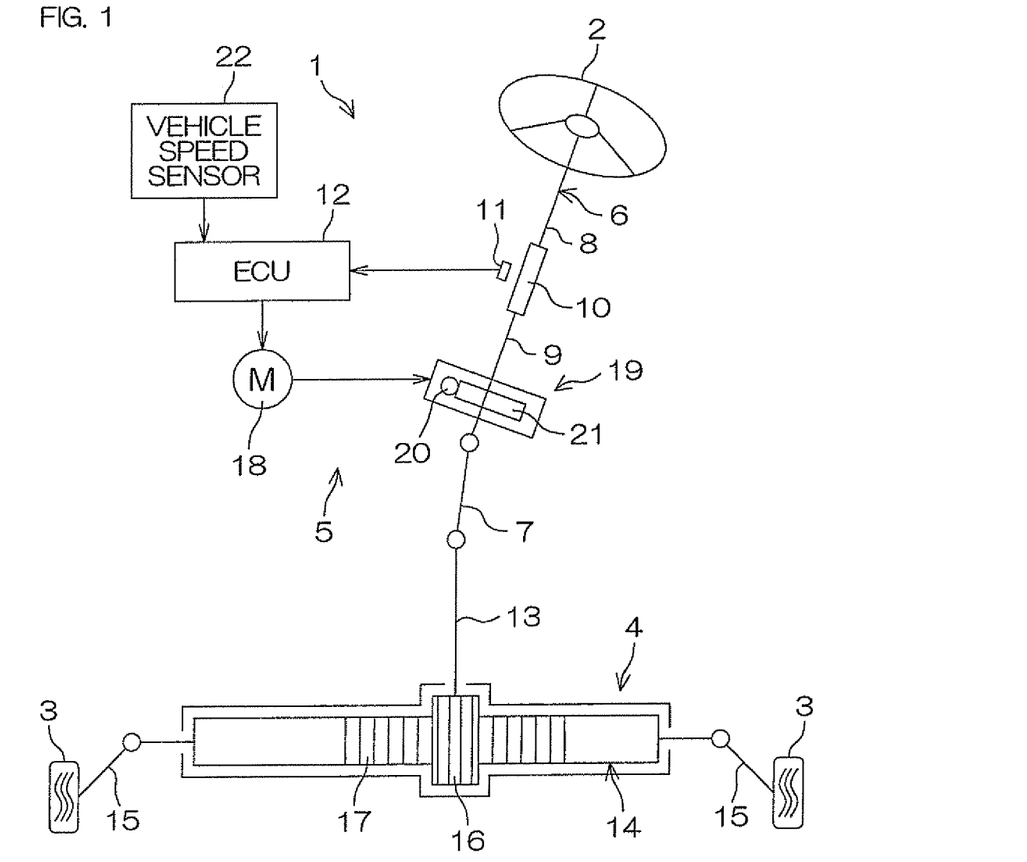
FIG. 1 is a schematic view showing a general configuration of an electric power steering apparatus to which a waterproof structure of an electronic unit according to an embodiment of the present invention is applied.

FIG. 1 is a schematic view showing a general configuration of an electric power steering apparatus 1 as a vehicle steering apparatus to which a waterproof structure of an electronic unit according to an embodiment of the present invention is applied. Referring to FIG. 1, the electric power steering apparatus 1 includes a steering wheel 2 as a steering member, a steered mechanism 4 that turns steered wheels 3 in tandem with rotation of the steering wheel 2, and a steering assist mechanism 5 for assisting steering by an operator. The steering wheel 2 and the steered mechanism 4 are mechanically joined via a steering shaft 6 and an intermediate shaft 7.

In the present embodiment, description is given based on an example in which the steering assist mechanism 5 gives an assist force (steering assist force) to the steering shaft 6. However, the present invention is also applicable to a structure in which the steering assist mechanism 5 gives an assist force to a pinion shaft described later and a structure in which the steering assist mechanism 5 gives an assist force to a rack shaft described later.

The steering shaft 6 includes an input shaft 8 joined to the steering wheel 2 and an output shaft 9 joined to the intermediate shaft 7. The input shaft 8 and the output shaft 9 are joined rotatably relative to each other on the same axis via a torsion bar 10.

A torque sensor 11 disposed around the steering shaft 6 detects a steering torque input into the steering wheel 2 based on a relative rotation displacement amount of the input shaft 8 and the output shaft 9. A torque detection result detected by the torque sensor 11 is input into an ECU (Electronic Control Unit) 12 as an electronic unit. In addition, a vehicle speed detection result from a vehicle speed sensor 90 is input into the ECU 12. The intermediate shaft 7 joins the steering shaft 6 and the steered mechanism 4.

The steered mechanism 4 consists of a rack-and-pinion mechanism including a pinion shaft 13 and a rack shaft 14 as a steered shaft. To each end portion of the rack shaft 14, the steered wheel 3 is joined via a tie rod 15 and a knuckle arm (not illustrated).

The pinion shaft 13 is joined to the intermediate shaft 7. The pinion shaft 13 rotates in tandem with steering of the steering wheel 2. On the tip end (lower end in FIG. 1) of the pinion shaft 13, a pinion 16 is provided.

The rack shaft 14 extends linearly along the right-left direction of a vehicle. At the middle in the axial direction of the rack shaft 14, a rack 17 that meshes with the pinion 16 is formed. By these pinion 16 and rack 17, the rotation of the pinion shaft 13 is converted into an axial movement of the rack shaft 14. By moving the rack shaft 14 in the axial direction, the steered wheels 3 can be turned.

When the steering wheel 2 is steered (rotated), this rotation is transmitted to the pinion shaft 13 via the steering shaft 6 and the intermediate shaft 7. Then, the rotation of the pinion shaft 13 is converted into an axial movement of the rack shaft 14 by the pinion 16 and the rack 17. Accordingly, the steered wheels 3 are turned.

The steering assist mechanism 5 includes a steering assist electric motor 18 and a speed reduction mechanism 19 for transmitting an output torque of the electric motor 18 to the steered mechanism 4. The speed reduction mechanism 19 includes a worm shaft 20 as a drive gear (input shaft) to which a drive force of the electric motor 18 is input, and a worm wheel 21 as a driven gear that meshes with the worm shaft 20.

The worm shaft 20 is joined to the output shaft (not illustrated) of the electric motor 18 via a joint not illustrated. The worm shaft 20 is driven to rotate by the electric motor 18. The worm wheel 21 is joined rotatably integrally with the steering shaft 6.

When the electric motor 18 drives and rotates the worm shaft 20, the worm wheel 21 is driven to rotate by the worm shaft 20, and the worm wheel 21 and the steering shaft 6 rotate integrally. Accordingly, a steering assist force is transmitted to the steering shaft 6.

The electric motor 18 is controlled by the ECU 12. The ECU 12 controls the electric motor 18 based on a torque detection result from the torque sensor 11 and a vehicle speed detection result from the vehicle speed sensor 22, etc. In detail, in the ECU 12, a target assist amount is determined by using a map of the relationship between the torque and the target assist amount stored for each vehicle speed, and performs control to bring the assist force to be generated by the electric motor 18 close to the target assist amount.

Figure 2A:
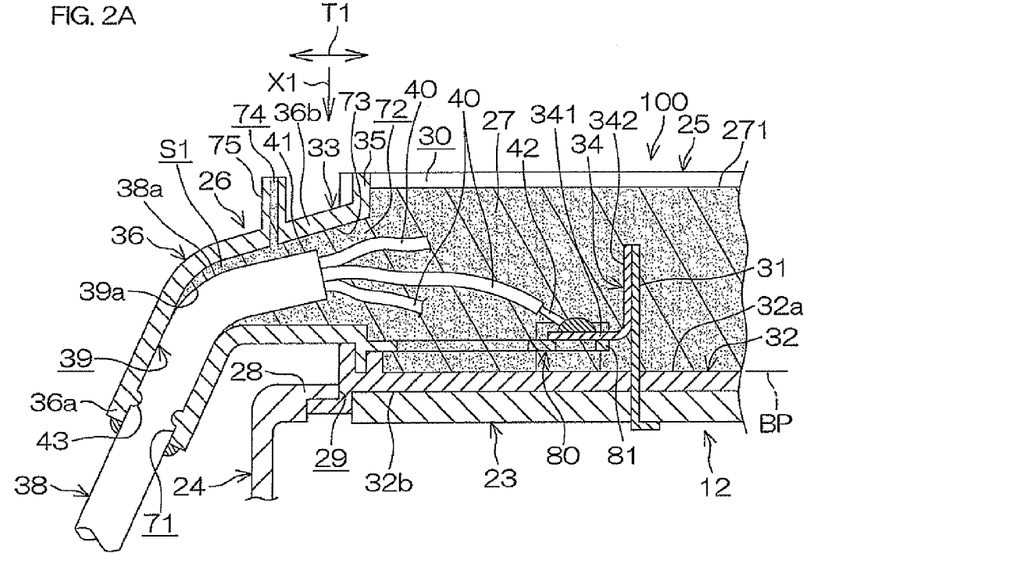
Figure 4:
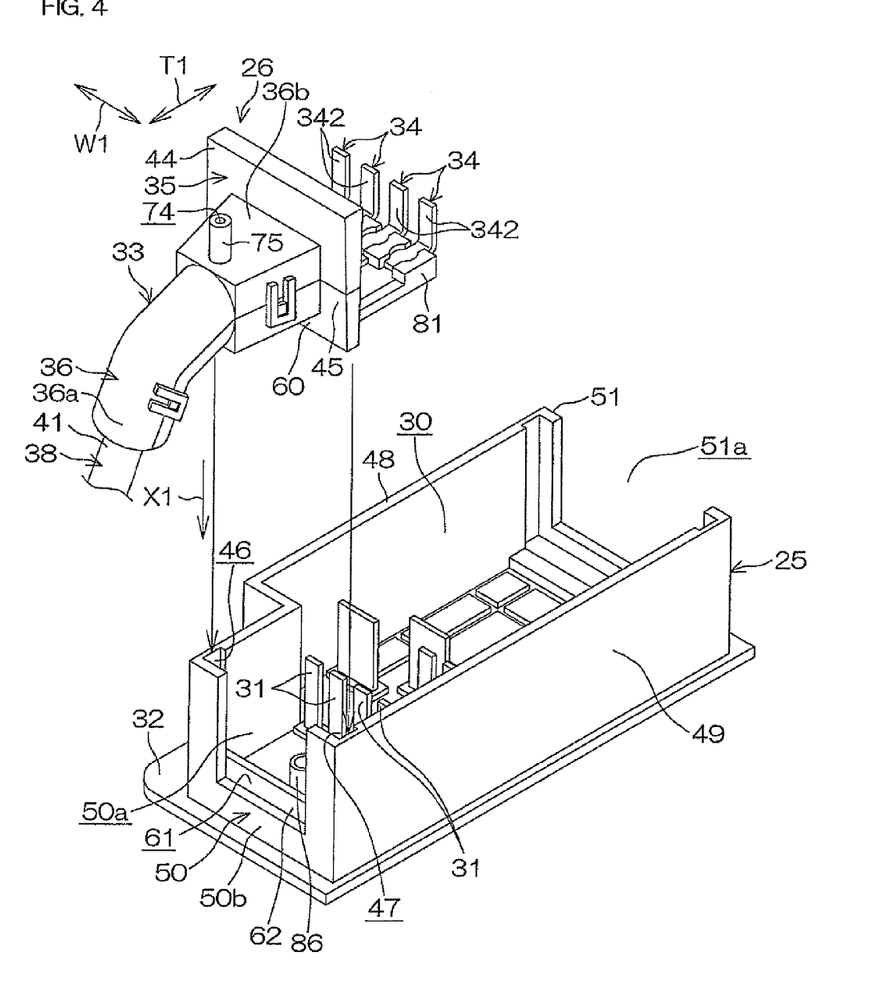
FIG. 4 is a schematic exploded perspective view of an auxiliary case and the connector of the electronic unit.

FIG. 2A is a sectional view of an essential portion of a waterproof structure 100 of the electronic unit. FIG. 4 is an exploded perspective view of the essential portion of the waterproof structure 100 of the electronic unit. The ECU 12 as the electronic unit includes a main case 24 and an auxiliary case 25. The main case 24 made of, for example, aluminum alloy and houses a substrate 23 and other electronic components (not illustrated). The auxiliary case 25 made of, for example, synthetic resin and houses first terminals 31 and other terminal groups.

The auxiliary case 25 as a unit case of the electronic unit (ECU 12) houses connector elements (for example, the first terminals 31 described later) that join wirings for taking signals from, for example, the torque sensor 11 into the ECU 12 and connector elements (for example, terminals) that join wirings for signal transmission via an integrated ECU and a CAN (Controller Area Network) on the vehicle side.

The waterproof structure 100 of the electronic unit includes the auxiliary case 25, a connector 26 attached to the auxiliary case 25, and a potting resin 27 filled in a liquid form into the essential portions inside the auxiliary case 25 and the connector 26 and then cured.

As shown in FIG. 2A, an attaching hole 29 having, for example, a rectangular shape is provided on the outer wall 28 of the main case 24, and the auxiliary case 25 is attached to the attaching hole 29. The auxiliary case 25 partially projects from the attaching hole 29 while covering the attaching hole 29. The auxiliary case 25 defines the housing portion 30. In the housing portion 30 of the auxiliary case 25, the first terminals 31 extending from the substrate 23 disposed inside the main case 24 are housed by being inserted through the bottom plate 32 of the auxiliary case 25.

The upper surface 32a of the bottom plate 32 forms a base plane BP that is made horizontal at the time of resin potting for injecting potting resin 27L in liquid form into the housing portion 30. In a recess portion 32b provided on the lower surface of the bottom plate 32, the substrate 23 is held. One ends of the first terminals 31 are connected to a conductive portion of the substrate 23 inside the main case 24.

The connector 26 includes an insulating body 33 attached to the auxiliary case 25 and second terminals 34 supported by the insulating body 33 and connected to the first terminals 31. The second terminal 34 includes a first portion 341 to which a conductor end portion 42 is connected and a second portion 342 connected to the first terminal 31. The first portion 341 and the second portion 342 are orthogonal to each other, and the first portion 341 is parallel to the base plane BP.

The insulating body 33 includes a wall portion 35 attached to the auxiliary case 25, a tubular cable lead-in portion 36 joined to the wall portion 35, and an extended portion 80 extended to the side opposite to the cable lead-in portion 36 from the wall portion 35 and disposed inside the housing portion 30. On the extended portion 80, a terminal holding portion 81 supporting the second terminals 34 is provided. The second portions 342 of the second terminals 34 and the wall portion 35 face each other in the plate thickness direction T1 of the wall portion 35.

The wall portion 35 forms a part of the wall of the auxiliary case 25 and partitions a part of the housing portion 30 in a state where the wall portion 35 is attached to the auxiliary case 25. The cable lead-in portion 36 defines a cable lead-in hole 39 for leading the cable 38 into the auxiliary case 25.

Figure 3:
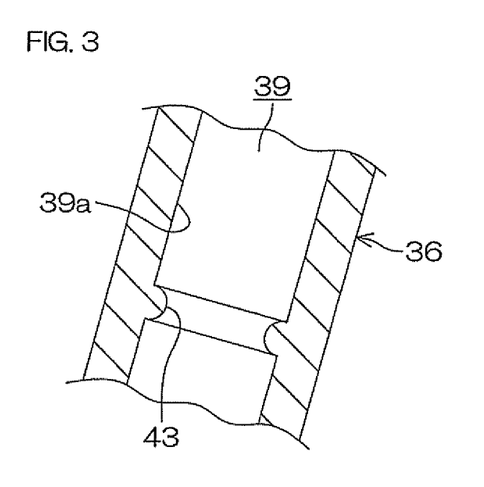
FIG. 3 is a longitudinal sectional view of an essential portion of a cable lead-in portion of an insulating body of a connector that is a component of the waterproof structure.

The cable 38 includes a plurality of covered electric wires 40 and an insulating tube 41 made of, for example, synthetic resin through which these covered electric wires 40 are inserted. The end portions of the covered electric wires 40 are stripped and conductor end portions 42 are connected to the second terminals 34 by resistance welding. On the inner periphery 39a of the cable lead-in hole 39 of the cable lead-in portion 36, an annular protrusion 43 (refer to FIG. 3 as well) in close contact with the outer periphery 38a of the cable 38 (the outer periphery of the tube 41 and the outer peripheries of the covered electric wires 40 exposed from the tube 41) is provided.

As shown in FIG. 2A and FIG. 4, the cable lead-in portion 36 of the insulating body 33 includes a first end portion 36a and a second end portion 36b. As shown in FIG. 2A, the first end portion 36a has a first opening 71 into which the cable 38 is led. The second end portion 36b has a second opening 72 from which the covered electric wires 40 of the cable 38 are led-out.

When the base plane BP of the auxiliary case 25 is made horizontal in the state where the insulating body 33 is attached to the auxiliary case 25, the second end portion 36b of the cable lead-in portion 36 is disposed higher than the first end portion 36a, and the inner upper wall 73 (corresponding to a part of the inner peripheral wall of the cable lead-in hole 39) of the second end portion 36b of the cable lead-in portion 36 is inclined so as to be displaced upward with the decreasing distance from the second opening 72.

As shown in FIG. 2A, the potting resin 27 is filled in most of the inside housing portion 30 and cured. The upper surface of the auxiliary case 25 is open, so that the potting resin 27 is open to the outside.

Figure 2B:
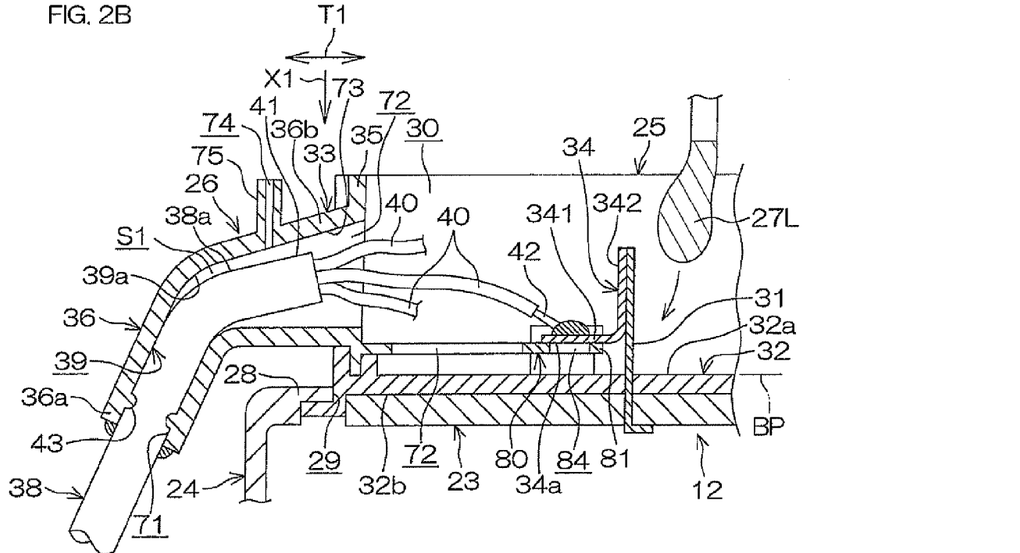

A part of the potting resin 27 is filled in the space S1 between the inner periphery 39a of the cable lead-in hole 39 of the connector 26 and the outer periphery 38a of the cable 38 and cured. The annular protrusion 43 is in close contact with the outer periphery 38a of the cable 38, so that when the potting resin 27L in liquid form before being cured is injected into the housing portion 30 as shown in FIG. 2B, and as shown in FIG. 2A, the potting resin 27L in liquid form is filled in the space S1 inside the cable lead-in hole 39, the potting resin 27L in liquid form is prevented from leaking to the outside (diagonally lower side in the drawing) from the cable lead-in hole 39 by the action of the annular protrusion 43.

The potting resin 27 has a potting horizontal surface 271 that is made horizontal at the time of resin potting. The potting horizontal surface 271 is parallel to the base plane BP. The cable lead-in hole 39 of the cable lead-in portion 36 extends diagonally downward from the wall portion 35 when the potting horizontal plane 271 is made horizontal. The base plane BP and the potting horizontal plane 271 may be inclined with respect to the horizontal plane in the state where the ECU 12 (the present electronic unit) is attached to a vehicle.

On, for example, the cable lead-in portion 36 of the insulating body 33, an air release hole 74 for releasing air at the time of resin potting is provided. In detail, the air release hole 74 is provided so as to penetrate through a tubular protrusion 75 provided integrally on the cable lead-in portion 36. The tubular protrusion 75 and the air release hole 74 extend so as to face upward when the potting horizontal surface 271 is made horizontal.

Figure 5:
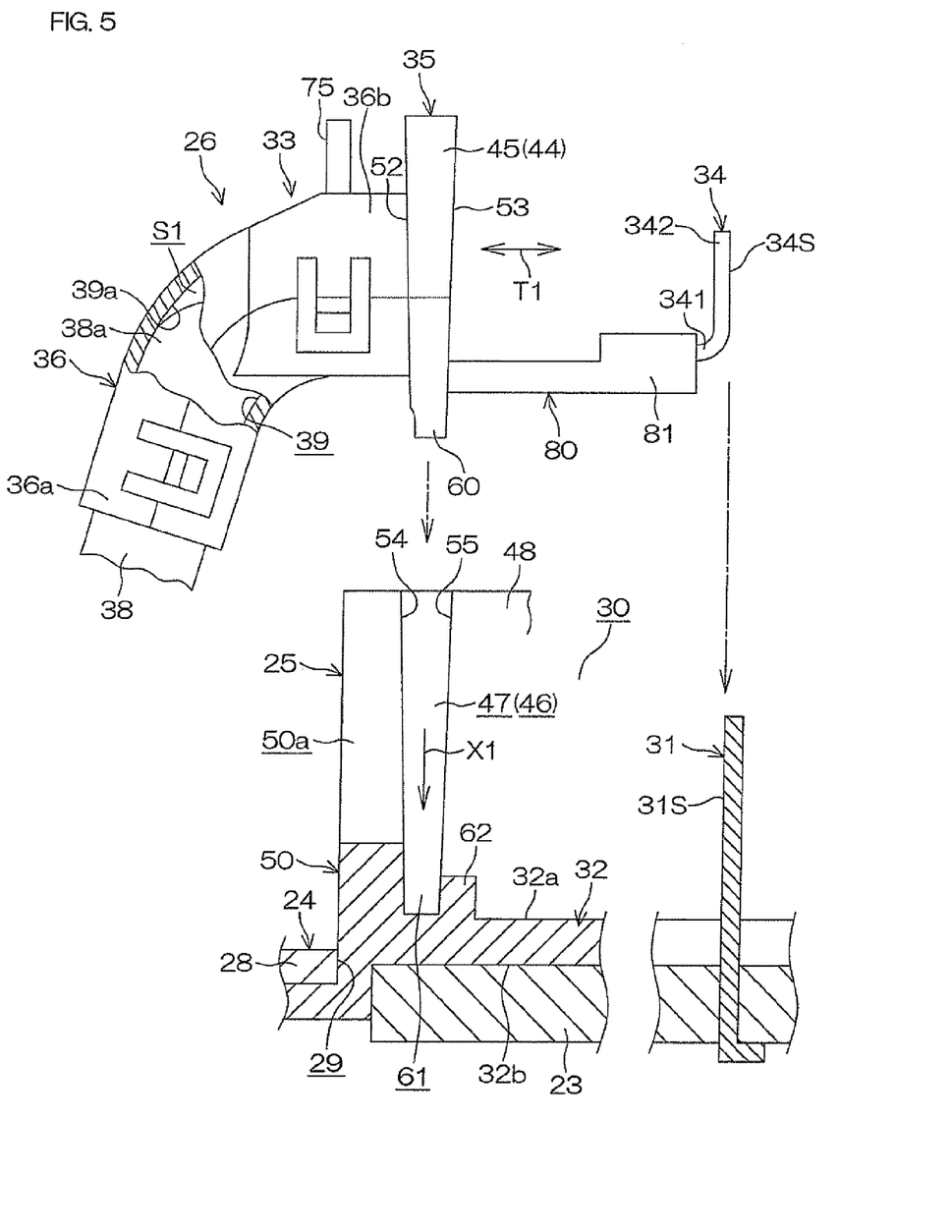
FIG. 5 is a side view of the connector.

As shown in FIG. 4 and FIG. 5, the wall portion 35 of the insulating body 33 of the connector 26 has a first side edge 44 and a second side edge 45. The auxiliary case 25 has a first insertion groove 46 and a second insertion groove 47 into which the first side edge 44 and the second side edge 45 of the wall portion 35 can be inserted in the sliding direction X1, respectively. Specifically, the insertion grooves 46 and 47 extend parallel to the sliding direction X1. The second portions 342 of the second terminals 34 and the first terminals 31 are parallel to the sliding direction X1.

The auxiliary case 25 includes a bottom plate 32 covering the attaching hole 29 of the main case 24 from the inner side, a first wall 48 and a second wall 49 (refer to FIG. 4) extending from the bottom plate 32 to the outer side (upper side in FIG. 2A) of the main case 24 through the attaching hole 29, a third wall 50 extending from the bottom plate 32 and having an open portion 50a, and a fourth wall 51 extending from the bottom plate 32 and having an open portion 51a.

As shown in FIG. 4, a recess portion provided on the inner surface of the first wall 48 and the inner surface of the third wall 50 define the first insertion groove 46. A recess portion provided on the inner surface of the second wall 49 and the inner surface of the fourth wall 51 define the second insertion groove 47.

The first side edge 44 and the second side edge 45 of the wall portion 35 of the connector 26 are inserted in the corresponding insertion grooves 46 and 47, and in a state where the open portion 50a of the third wall 50 is covered by the wall portion 35 and the open portion 51a of the fourth wall 51 is covered by an element (equivalent to the wall portion 35) not illustrated, the housing portion 30 is defined by the bottom plate 32, the walls 48 to 51, the wall portion 35, and the element not illustrated (equivalent to the wall portion 35).

The end edge 60 on the sliding direction X1 side of the wall portion 35 of the connector 26 is press-fitted to the insertion groove 61 of the auxiliary case 25. A rib 62 that partitions a part of the open portion 50a and is in proximity to and faces the portion 50b of the third wall 50 is formed to project from the bottom plate 32. The insertion groove 61 is defined between the portion 50b of the third wall 50 and the rib 62.

As shown in FIG. 5, fitting surfaces 52 and 53 of the side edges 44 and 45 of the wall portion 35 and fitting surfaces 54 and 55 of the corresponding insertion grooves 46 and 47 are formed of tapering surfaces inclined oppositely to each other with respect to the sliding direction X1 at equal angles. Contact surfaces 31S and 34S that come into contact with each other of the first terminals 31 and the second terminals 34 are parallel to the sliding direction X1. The fitting surfaces 52 and 53 of the side edges 44 and 45 shown in FIG. 4 face each other in the plate thickness direction T1 of the wall portion 35.

Figure 6:
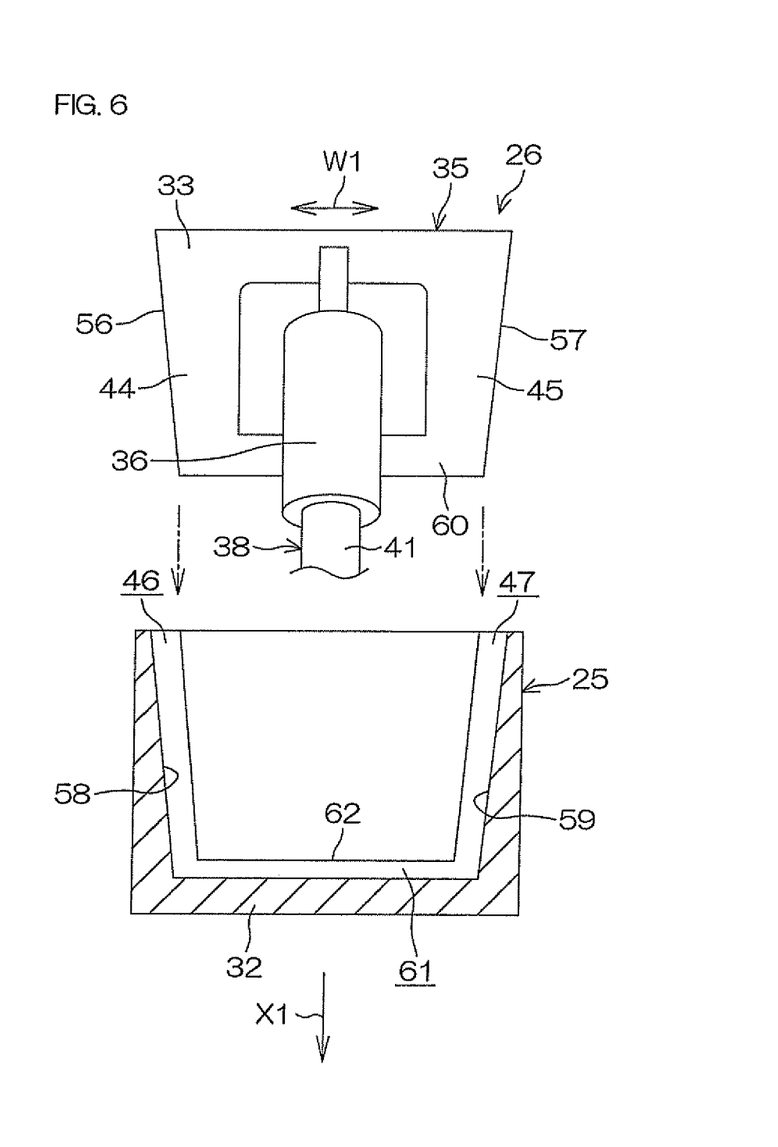
FIG. 6 is a partial sectional exploded front view of essential portions of the connector and the auxiliary case.

On the other hand, as shown in FIG. 6, fitting surfaces 56 and 57 as surfaces facing each other of both side edges 44 and 45 and fitting surfaces 58 and 59 of the corresponding insertion grooves 46 and 47 with respect to the width direction W1 (corresponding to a direction orthogonal to both of the sliding direction X1 and the plate thickness direction T1) of the wall portion 35, are formed of tapering surfaces inclined oppositely to each other with respect to the sliding direction X1 at equal angles.

Figure 7:
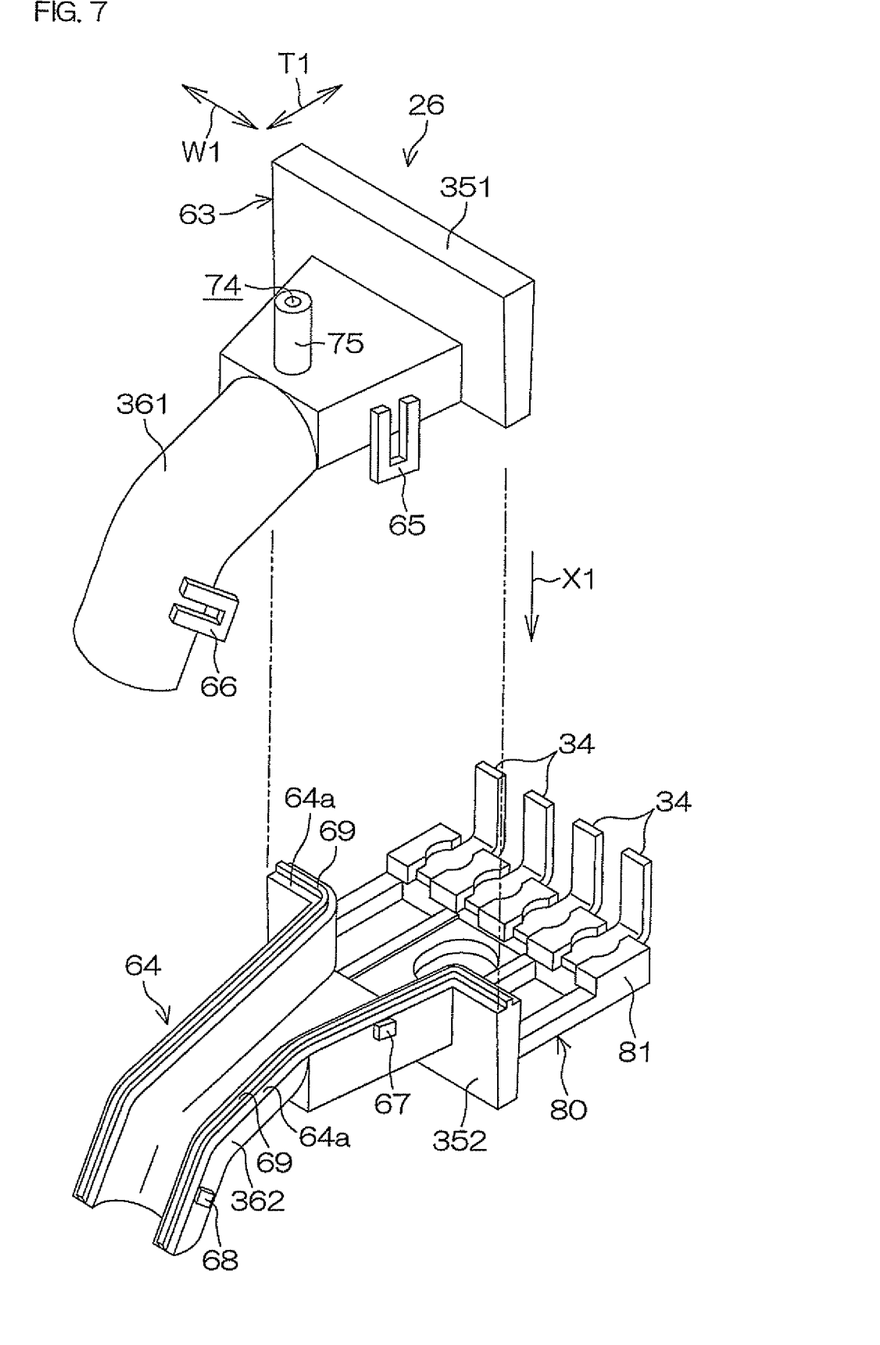
FIG. 7 is an exploded perspective view of a first division body and a second division body of the connector.

Referring to FIG. 7, the insulating body 33 of the connector 26 is formed by combining the first division body 63 and the second division body 64. The first division body 63 includes a half body 351 of the wall portion 35 and a half body 361 of the cable lead-in portion 36, and the second division body 64 includes a half body 352 of the wall portion 35 and a half body 362 of the cable lead-in portion 36.

The wall portion 35 is formed by combining both half bodies 351 and 352 of the wall portion 35, and the cable lead-in portion 36 is formed by combining both half bodies 361 and 362 of the cable lead-in portion 36. The terminal holding portion 81 is provided on the second division body 64.

By hooking and engaging elastically deformable annular hooks 65 and 66 provided on either one (in the illustrated example, the half body 351) of the half bodies 361 and 362 of the cable lead-in portion 36 with engagement projections 67 and 68 provided on the other half body (in the illustrated example, the half body 352), the coupled state of the division bodies 63 and 64 is reliably held.

Figure 8:
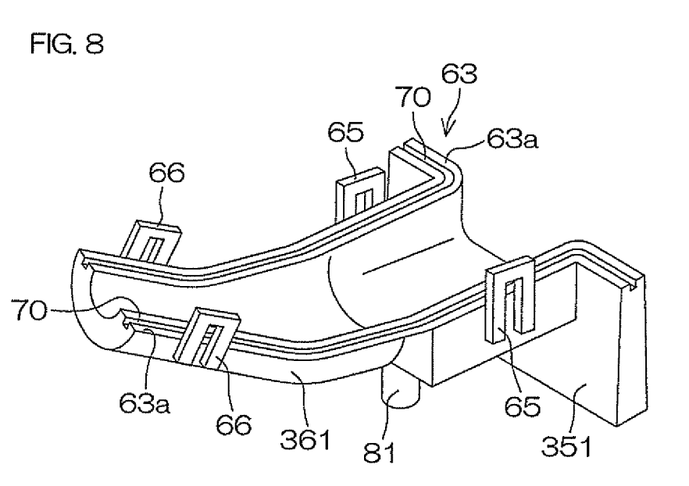
FIG. 8 is a perspective view of a turned-over state of the first division body constituting a part of the insulating body of the connector.

Referring to FIG. 7 and FIG. 8 that is a perspective view showing a turned-over state of the first division body 63, fitting surfaces 63a and 64a of the division bodies 63 and 64 extend from the corresponding half bodies 351 and 352 of the wall portion 35 to the corresponding half bodies 361 and 362 of the cable lead-in portion 36.

Figure 9:
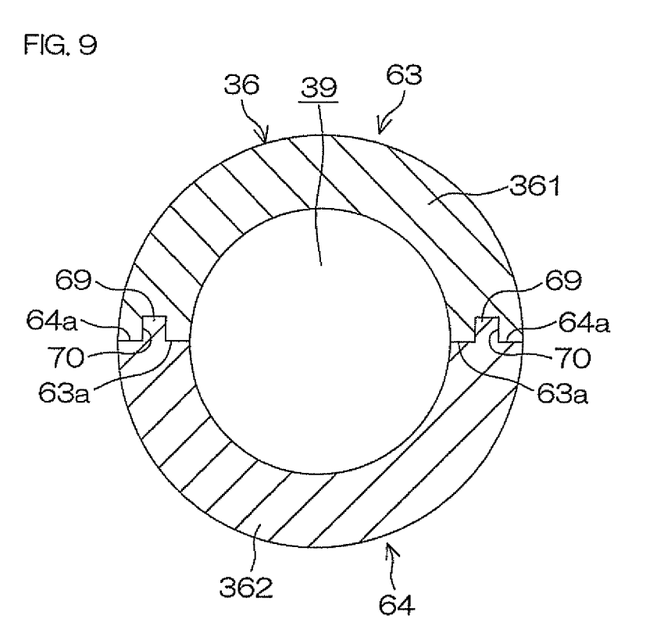
FIG. 9 is a cross-sectional view of an essential portion of the cable lead-in portion of the insulating body.

As shown in FIG. 9, protrusions 69 are provided on either one pair (in the illustrated example, the pair of fitting surfaces 64a) of the pairs of fitting surfaces 63a and 64a of the division bodies 63 and 64 and extend along the extending directions of the pair of fitting surfaces (the pair of fitting surfaces 64a). Recess grooves 70 are provided on the other pair of fitting surfaces (in the illustrated example, the pair of fitting surfaces 63a) and extend in the extending directions of the other pair of fitting surfaces (the pair of fitting surfaces 63a). The protrusions 69 fit the recess grooves 70. Accordingly, a labyrinth structure is formed, and the division bodies 63 and 64 are combined liquid-tightly.

Figure 10:
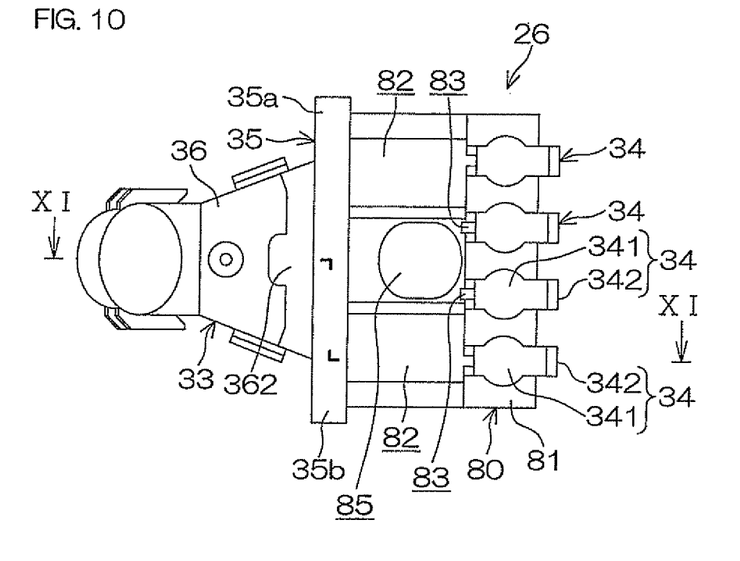
FIG. 10 is a plan view of the connector from which the cable is removed.
Figure 11:
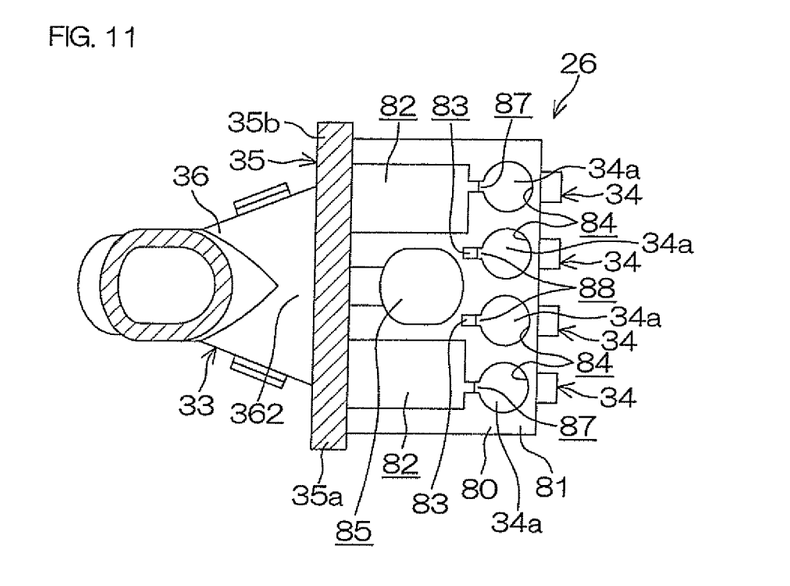
FIG. 11 is a bottom view of the connector from which the cable is removed.

As shown in FIG. 10 that is a plan view and FIG. 11 that is a bottom view, the extended portion 80 of the insulating body 33 includes the above-described terminal holding portion 81 that holds the plurality of second terminals 34 horizontally, a plurality of through holes 82 and 83, inspection probe insertion holes 84 provided in the terminal holding portion 81 and facing the lower surfaces 34a of the second terminals 34 (the lower surfaces of the first portions 341), and a temporary holding hole 85.

On the other hand, as shown in FIG. 4, a temporary holding convex portion 86 having, for example, a tubular shape and protruding upward from the bottom plate 32 of the auxiliary case 25 is provided. By fitting the temporary holding convex portion 86 shown in FIG. 4 in the temporary holding hole 85 shown in FIG. 10, the connector 26 is temporarily held on the auxiliary case 25 at the time of manufacturing.

The inspection probe insertion holes 84 are used for an inspection with a single connector 26 by bringing an inspection probe into contact with the lower surfaces 34a of the second terminals 34 (the lower surfaces of the first portions 341) through the inspection probe insertion holes 84 before the connector 26 is attached to the auxiliary case 25.

Figure 12:
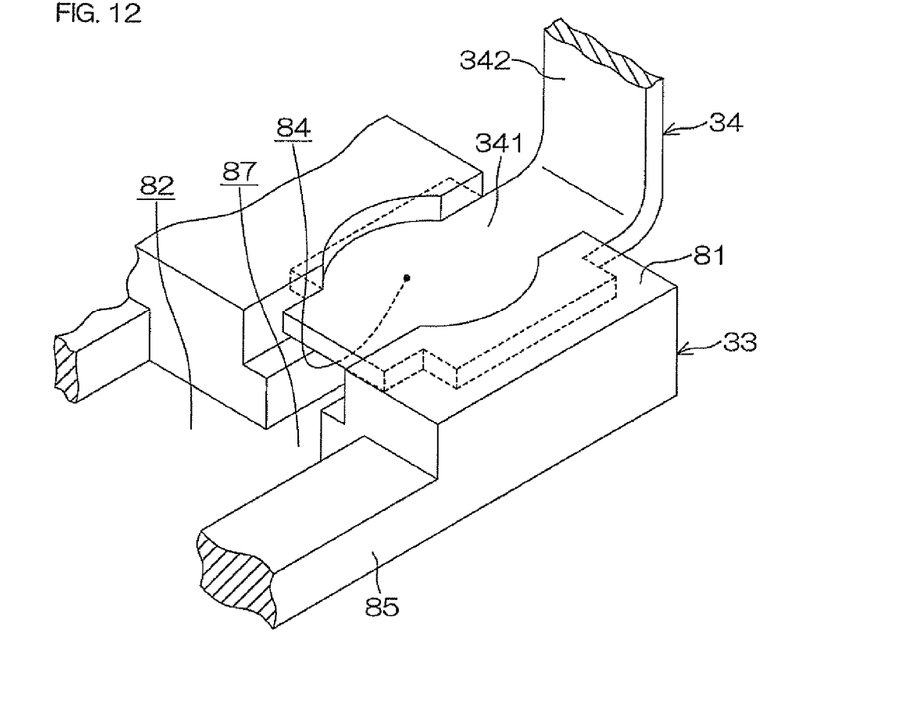
FIG. 12 is a schematic sectional view of the surrounding of the second terminal of the connector.

Each inspection probe insertion hole 84 communicates with the corresponding through hole 82 or 83. In detail, the inspection probe insertion hole 84 for the second terminal 34 disposed near the through hole 82 in FIG. 11 communicates with the corresponding through hole 82 via a slit 87 as shown in FIG. 12. The through hole 82 is a large-sized through hole provided for reducing the thickness.

Figure 13:
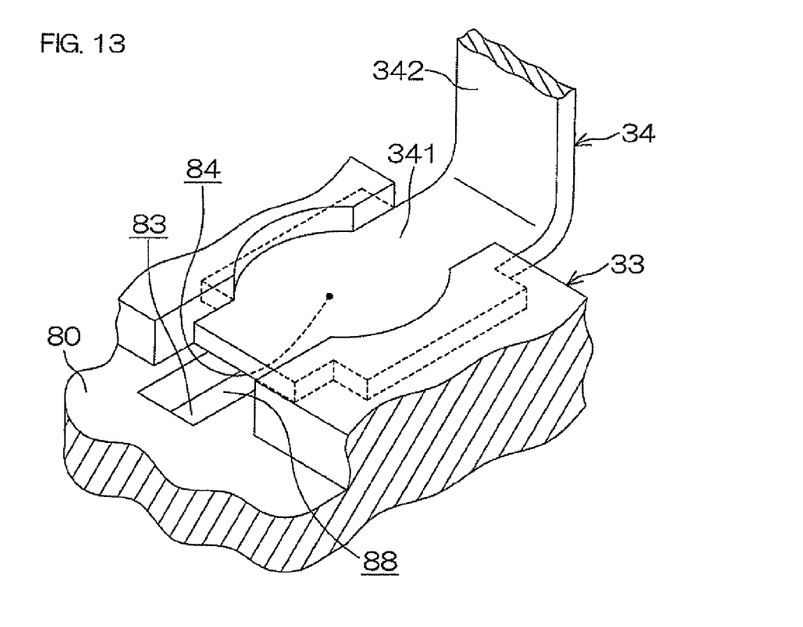
FIG. 13 is a schematic sectional view of the surrounding of another second terminal of the connector.

On the other hand, the inspection probe insertion hole 84 for the second terminal 34 disposed near the through hole 83 in FIG. 11 communicates with the corresponding through hole 83 via a slit 88 as shown in FIG. 13. The through hole 83 is a small-sized through hole provided exclusively for releasing air particles during potting.

According to the present embodiment, by attaching the connector 26 to the auxiliary case 25, the second terminals 34 of the connector 26 are connected to the first terminals 31 of the auxiliary case 25, and by closing the open portion 50a of the auxiliary case 25 by the wall portion 35 of the connector 26, a part of the housing portion 30 of the auxiliary case 25 is partitioned by the wall portion 35 of the connector 26. Next, the potting resin 27L in liquid form is filled in the space S1 between the inner periphery 39a of the cable lead-in hole 39 and the outer periphery 38a of the cable 38 and the housing portion 30 of the auxiliary case 25 and then cured, and accordingly, a waterproof function is obtained. It becomes unnecessary to use a connector with a waterproof cap conventionally used, and the structure can be simplified.

In addition, the side edges 44 and 45 of the wall portion 35 of the insulating body 33 of the connector 26 fit in the corresponding insertion grooves 46 and 47 of the auxiliary case 25 to form a labyrinth structure, so that the potting resin 27L in liquid form can be prevented from leaking. Further, the side edges 44 and 45 of the wall portion 35 of the insulating body 33 of the connector 26 are slide-inserted into the corresponding insertion grooves 46 and 47 of the auxiliary case, so that the assembly is easy.

The side edges 44 and 45 of the wall portion 35 of the insulating body 33 of the connector 26 are press-fitted into the corresponding insertion grooves 46 and 47 of the auxiliary case 25 by fitting between tapering surfaces (between the fitting surfaces 52 and 53 and the fitting surfaces 54 and 55), so that the potting resin 27L in liquid form can be further prevented from leaking, and the position accuracy of the connector 26 with respect to the auxiliary case 25 can be improved. Therefore, the position accuracy between the first terminals 31 and the second terminals 34 can be improved, and excellent contact between the terminals 31 and 34 can be secured.

By the operation of slide-inserting the side edges 44 and 45 of the wall portion 35 of the insulating body 33 of the connector 26 into the corresponding insertion grooves 46 and 47 of the auxiliary case 25, the contact surfaces 34S of the second terminals 34 are caused to slide on the contact surfaces 31S of the first terminals 31 and connection between the terminals 31 and 34 is secured. In particular, the side edges 44 and 45 of the wall portion 35 are press-fitted into the corresponding insertion grooves 46 and 47 and the position accuracy between the terminals 31 and 34 is made high, so that excellent contact can be secured between the terminals 31 and 34.

The annular protrusion 43 provided on the inner periphery 39a of the cable lead-in hole 39 comes into close contact with the outer periphery 38a (in detail, the outer periphery of the tube 41) of the cable 38, so that the potting resin 27L in liquid form before being cured which entered the inside of the cable lead-in hole 39 can be prevented from leaking.

The potting resin 27 has a potting horizontal surface 271 that is made horizontal at the time of resin potting, and the cable lead-in hole 39 extends diagonally downward from the wall portion 35 when the potting horizontal surface 271 is made horizontal. Therefore, when the potting resin 27L in liquid form is injected, air bubbles are hardly generated, so that the potting resin 27 can be densely filled inside the cable lead-in hole 39.

Further, on the insulating body 33, an air release hole 74 for releasing air during resin potting is provided, so that when the potting resin 27L in liquid form is injected, air inside the insulating body 33 (particularly, inside the cable lead-in hole 39) can be smoothly released through the air release hole 74, and therefore, the potting resin 27 can be densely filled inside the insulating body 33 (particularly, inside the cable lead-in hole 39).

In addition, the fitting surfaces 63a and 64a of the first division body 63 and the second division body 64 constituting the connector 26 are labyrinth-coupled to each other by using the protrusions 69 and the recess grooves 70 that fit each other, so that the potting resin 27L in liquid form before being cured can be prevented from leaking.

In manufacturing, in the process of potting the resin into the housing portion 30 of the auxiliary case 25 to which the connector 26 is joined, as shown in FIG. 2B, when the potting resin 27L in liquid form is injected into the housing portion 30 in the state where the base plane BP is made horizontal, the liquid level of the potting resin 27L in liquid form rises from the first end portion 36a to the second end portion 36b at the higher position inside the cable lead-in portion 36 of the insulating body 33. At this time, the inner upper wall 73 of the second end portion 36b is inclined so as to be displaced upward with the decreasing distance from the second opening 72, so that air accumulation is unlikely to remain in the potting resin 27L in liquid form inside the cable lead-in hole 39. Therefore, no void is formed in the cured potting resin 27 shown in FIG. 2A, so that the waterproofness is not deteriorated.

In the process of potting the resin, as shown in FIG. 12 and FIG. 13, air in the inspection probe insertion holes 84 of the terminal holding portion 81 can be moved into, for example, the through holes 82 and 83 via the slits 87 and 88 and released upward from the through holes 82 and 83, so that air is unlikely to remain in the inspection probe insertion holes 84. Therefore, no void is formed in the cured potting resin 27 shown in FIG. 2A, so that the waterproofness is not deteriorated.

The present invention is not limited to the above-described embodiment, and for example, the inspection probe insertion holes 84 and the corresponding through holes 82 and 83 may directly communicate with each other although this is not shown.

The present invention has been described in detail above based on a detailed embodiment, however, a person skilled in the art who understands the contents described above will easily conceive of alterations, modifications, and equivalents thereof. Therefore, the present invention should cover the scope of the claims and equivalents thereof.

The present application corresponds to Japanese Patent Application No. 2011-58269 filed in Japanese Patent Office on Mar. 16, 2011 and Japanese Patent Application No. 2011-163087 filed in Japanese Patent Office on Jul. 26, 2011, the whole disclosures of which are incorporated herein by reference.

What is claimed is:

1. A waterproof structure of all electronic unit comprising: a case that defines a housing portion housing a first terminal and has an open portion configured to open the housing portion; a connector including an insulating body attached to the case and a second terminal supported by the insulating body and connecting a conductor end portion of a cable to the first terminal; and a potting resin, wherein the insulating body includes a wall portion that partitions a part of the housing portion by covering the open portion, and a cable lead-in portion that defines a cable lead-in hole for leading the cable into the case and is joined to the wall portion, the potting resin is filled in a space between an inner periphery of the cable lead-in hole and an outer periphery of the cable and the housing portion and cured, wherein the wall portion has a pair of side edges, the case has a pair of insertion grooves, each of the side edges of the wall portion is inserted into a corresponding insertion groove in a sliding direction, each of the side edges of the wall portion is press-fitted into the corresponding insertion groove of the case, and fitting surfaces of each of the side edges of the wall portion and fitting surfaces of the corresponding insertion groove are formed of tapering surfaces inclined oppositely to each other with respect to the sliding direction at equal angles.

2. The waterproof structure of the electronic unit according to claim 1, wherein
contact surfaces that come into contact with each other of the first terminal and the second terminal are orthogonal to a plate thickness direction of the wall portion and parallel to the sliding direction.

3. The waterproof structure of the electronic unit according to claim 1, wherein
an annular protrusion that comes into close contact with the outer periphery of the cable is provided on the inner periphery of the cable lead-in hole.

4. A waterproof structure of an electronic unit comprising: a case that defines a housing portion housing a first terminal and has an open portion configured to open the housing portion; a connector including an insulating body attached to the case and a second terminal supported by the insulating body and connecting a conductor end portion of a cable to the first terminal; and a potting resin, wherein the insulating body includes a wall portion that partitions a part of the housing portion by covering the open portion, and a cable lead-in portion that defines a cable lead-in hole for leading the cable into the case and is joined to the wall portion, the potting resin is filled in a space between an inner periphery of the cable lead-in hole and an outer periphery of the cable and the housing portion and cured, the potting resin includes a first surface exposed to air and a second surface opposite to the first surface, the case includes an inner surface that fits the second surface, and the cable lead-in hole extends diagonally downward from the wall portion when the first surface is made horizontal above the second surface.

5. A waterproof structure of an electronic unit comprising: a case that defines a housing portion housing a first terminal and has an open portion configured to open the housing portion; a connector including an insulating body attached to the case and a second terminal supported by the insulating body and connecting a conductor end portion of a cable to the first terminal; and a potting resin, wherein the insulating body includes a wall portion that partitions a part of the housing portion by covering the open portion, and a cable lead-in portion that defines a cable lead-in hole for leading the cable into the case and is joined to the wall portion, the potting resin is filled in a space between an inner periphery of the cable lead-in hole and an outer periphery of the cable and the housing portion and cured, an air release hole for releasing air at a time of resin potting is provided on the insulating body, the potting resin includes a first surface exposed to air and a second surface opposite to the first surface, the case includes an inner surface that fits the second surface, the air releasing hole is provided so as to penetrate a tubular protrusion provided integrally on the cable lead-in portion, and the air releasing hole extends so as to face upward when the first surface is made horizontal above the second surface.

6. The waterproof structure of the electronic unit according to claim 1, wherein
the insulating body is formed by combining a first division body and a second division body, and
a protrusion provided on either one of fitting surfaces of the first division body and the second division body is fitted in a recess groove provided on the other of the fitting surfaces.

7. A waterproof structure of an electronic unit comprising: a case that defines a housing portion housing a first terminal and has an open portion configured to open the housing portion; a connector including an insulating body attached to the case and a second terminal supported by the insulating body and connecting a conductor end portion of a cable to the first terminal; and a potting resin, wherein the insulating body includes a wall portion that partitions a part of the housing portion by covering the open portion, and a cable lead-in portion that defines a cable lead-in hole for leading the cable into the case and is joined to the wall portion, the potting resin is filled in a space between an inner periphery of the cable lead-in hole and an outer periphery of the cable and the housing portion and cured, the case includes a base plane that is made horizontal at a time of resin potting, the cable lead-in portion includes a first end portion having a first opening into which the cable is led, and a second end portion having a second opening from which the cable is led out and adjacent to the wall portion, when the base plane is made horizontal, the second end portion is disposed higher than the first end portion of the cable lead-in portion, and an inner upper wall of the second end portion is inclined so as to be displaced upward with the decreasing distance from the second opening, the potting resin includes a first surface exposed to air and a second surface opposite to the first surface, the case includes an inner surface that fits the second surface, and the inner surface of the case includes an inner surface base plane that is parallel to the first surface of the potting resin.

8. A waterproof structure of ml electronic unit comprising:

a case that defines a housing portion housing a first terminal and has an open portion configured to open the housing portion:

a connector including an insulating body attached to the case and a second terminal supported by the insulating body and connecting a conductor end portion of a cable to the first terminal; and a potting resin, wherein the insulating body includes a wall portion that partitions a part of the housing portion by covering the open portion, and a cable lead-in portion that defines a cable lead-in hole for leading the cable into the case and is joined to the wall portion, the potting resin is filled in a space between an inner periphery of the cable lead-in hole and an outer periphery of the cable and the housing portion and cured, the case includes a base plane that is made horizontal at a time of resin potting, the cable lead-in portion includes a first end portion having a first opening into which the cable is led, and a second end portion having a second opening from which the cable is led out and adjacent to the wall portion, when the base plane is made horizontal, the second end portion is disposed higher than the first end portion of the cable lead-in portion, and an inner upper wall of the second end portion is inclined so as to be displaced upward with the decreasing distance from the second opening, the insulating body has an extended portion extending from the wall portion to the inside of the housing portion, the extended portion includes a through hole, a terminal holding portion that holds the second terminal, and an inspection probe insertion hole that is provided in the terminal holding portion and facing a lower surface of the second terminal, and the inspection probe insertion hole communicates with the through hole.

9. The waterproof structure of the electronic unit according to claim 8, wherein the extended portion includes a slit that makes the inspection probe insertion hole communicate with the through hole.

* * * * *

UNITED STATES PATENT AND TRADEMARK OFFICE
CERTIFICATE OF CORRECTION

PATENT NO. : 8,872,025 B2  
APPLICATION NO. : 13/418816  
DATED : October 28, 2014  
INVENTOR(S) : Toshio Tamai et al.

Page 1 of 1

It is certified that error appears in the above-identified patent and that said Letters Patent is hereby corrected as shown below:

On the Title Page

Item (73), Assignee: change "Jtekt Corporation," to read --JTEKT CORPORATION,--.

In the Claims

Column 9, claim 1, line 22, change "1. A waterproof structure of [all] electronic unit comprising:" to read --1. A waterproof structure of an electronic unit comprising:--.

Column 11, claim 8, line 1, change "8. A waterproof structure of [ml] electronic unit comprising:" to read --1. A waterproof structure of an electronic unit comprising:--.

Signed and Sealed this  
Third Day of February, 2015

Michelle K. Lee  
*Deputy Director of the United States Patent and Trademark Office*